(12) United States Patent
Volfovski et al.

(10) Patent No.: US 9,538,583 B2
(45) Date of Patent: Jan. 3, 2017

(54) SUBSTRATE SUPPORT WITH SWITCHABLE MULTIZONE HEATER

(71) Applicant: APPLIED MATERIALS, INC., Santa Clara, CA (US)

(72) Inventors: Leon Volfovski, Mountain View, CA (US); Mayur G. Kulkarni, San Jose, CA (US); Alex Minkovich, Campbell, CA (US); Michael R. Rice, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 499 days.

(21) Appl. No.: 13/742,639

(22) Filed: Jan. 16, 2013

(65) Prior Publication Data
US 2014/0197151 A1  Jul. 17, 2014

(51) Int. Cl.
| H05B 3/68 | (2006.01) |
| H05B 3/26 | (2006.01) |
| H01L 21/67 | (2006.01) |
| H05B 1/02 | (2006.01) |

(52) U.S. Cl.
CPC ............ *H05B 3/26* (2013.01); *H01L 21/67103* (2013.01); *H05B 1/0233* (2013.01)

(58) Field of Classification Search
CPC ......... H01L 21/67103; H01L 21/67–21/67796; H05B 1/0233; H05B 3/26; H05B 3/68–3/688
USPC ............................................. 219/443.1–168.2
See application file for complete search history.

(56) References Cited

U.S. PATENT DOCUMENTS

| 5,396,047 | A | * | 3/1995 | Schilling et al. | 219/448.11 |
| 5,504,471 | A | * | 4/1996 | Lund | 338/320 |
| 5,886,864 | A |   | 3/1999 | Dvorsky | |
| 6,133,557 | A | * | 10/2000 | Kawanabe | H01L 21/67103 |
|           |   |   |         |          | 219/544 |
| 6,310,755 | B1 | * | 10/2001 | Kholodenko et al. | 361/234 |
| 6,717,116 | B1 | * | 4/2004 | Ito et al. | 219/444.1 |
| 7,189,946 | B2 | * | 3/2007 | Goto et al. | 219/444.1 |
| 7,247,819 | B2 | * | 7/2007 | Goto et al. | 219/444.1 |
| 8,193,473 | B2 | * | 6/2012 | Unno | H01L 21/67103 |
|           |    |   |         |      | 118/725 |

(Continued)

OTHER PUBLICATIONS

International Search Report and Written Opinion mailed Jun. 2, 2014 for PCT Application No. PCT/US2014/010311.

*Primary Examiner* — Sang Y Paik
(74) *Attorney, Agent, or Firm* — Moser Taboada; Alan Taboada

(57) ABSTRACT

Embodiments of substrate supports with a heater are provided herein. In some embodiments, a substrate support may include a first member to distribute heat to a substrate when present above a first planar surface of the first member, a second member disposed beneath the first member, the second member including a plurality of resistive heating elements, wherein the plurality of resistive heating elements provide local temperature compensation to the first member to heat the substrate when present, a third member disposed beneath the second member, the third member including one or more base heating zones to provide a base temperature profile to the first member, and a fourth member disposed beneath the third member, the fourth member including a first set of electrical conductors coupled to each of the resistive heating elements.

18 Claims, 6 Drawing Sheets

(56) References Cited

U.S. PATENT DOCUMENTS

| | | |
|---|---|---|
| 8,791,392 B2 * | 7/2014 | Singh .................... 219/446.1 |
| 2006/0144516 A1 | 7/2006 | Ricci et al. |
| 2009/0215201 A1 | 8/2009 | Benjamin et al. |
| 2010/0078424 A1 | 4/2010 | Tsukamoto et al. |
| 2012/0196242 A1 | 8/2012 | Volfovski et al. |
| 2013/0037532 A1 | 2/2013 | Volfovski et al. |
| 2013/0087309 A1 | 4/2013 | Volfovski et al. |

* cited by examiner

SUBSTRATE SUPPORT WITH SWITCHABLE MULTIZONE HEATER

FIELD

Embodiments of the present invention generally relate to substrate processing equipment, and more specifically to a substrate support.

BACKGROUND

As the critical dimensions of devices continue to shrink, improved control over processes, such as heating, cooling, or the like may be required. For example, a substrate support may include a heater to provide a desired temperature of a substrate disposed on the substrate support during processing. The inventors have found that existing substrate supports with heaters may not have enough resolution to compensate for localized process variations caused by temperature and other process variations.

Thus, the inventors have provided an improved substrate support having a heater to facilitate control of the temperature of a substrate.

SUMMARY

Embodiments of substrate supports with a heater are provided herein. In some embodiments, a substrate support may include a first member to distribute heat to a substrate when present above a first planar surface of the first member, a second member disposed beneath the first member, the second member including a plurality of resistive heating elements, wherein the plurality of resistive heating elements provide local temperature compensation to the first member to heat the substrate when present, a third member disposed beneath the second member, the third member including one or more base heating zones to provide a base temperature profile to the first member, and a fourth member disposed beneath the third member, the fourth member including a first set of electrical conductors coupled to each of the resistive heating elements.

In some embodiments, a substrate support may include a multilayer heater including a first member to distribute heat to a substrate when present above a first planar surface of the first member, a second member disposed beneath the first member, the second member including a plurality of resistive heating elements, wherein the plurality of resistive heating elements provide local temperature compensation to the first member to heat the substrate when present, a third member disposed beneath the second member, the third member including one or more base heating zones to provide a base temperature profile to the first member, and a fourth member disposed beneath the third member, the fourth member including a first set of electrical conductors coupled to each of the resistive heating elements, a plurality of substrate support pins disposed on the first planar surface of the first member to support a backside surface of a substrate when present on the substrate support, a plurality of lift pins holes formed through each of the first, second, third and fourth members, a plurality of substrate lift pins movably disposed in the plurality of lift pins holes and configured to move the substrate onto the plurality of substrate support pins, and a control system coupled configured to receive input from the plurality of resistive temperature detectors and to control each of the plurality of resistive heating elements, wherein the control system includes a first multiplexor electrically coupled to the plurality of resistive heating elements and a second multiplexor electrically coupled to the plurality of resistive temperature detectors.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1A:
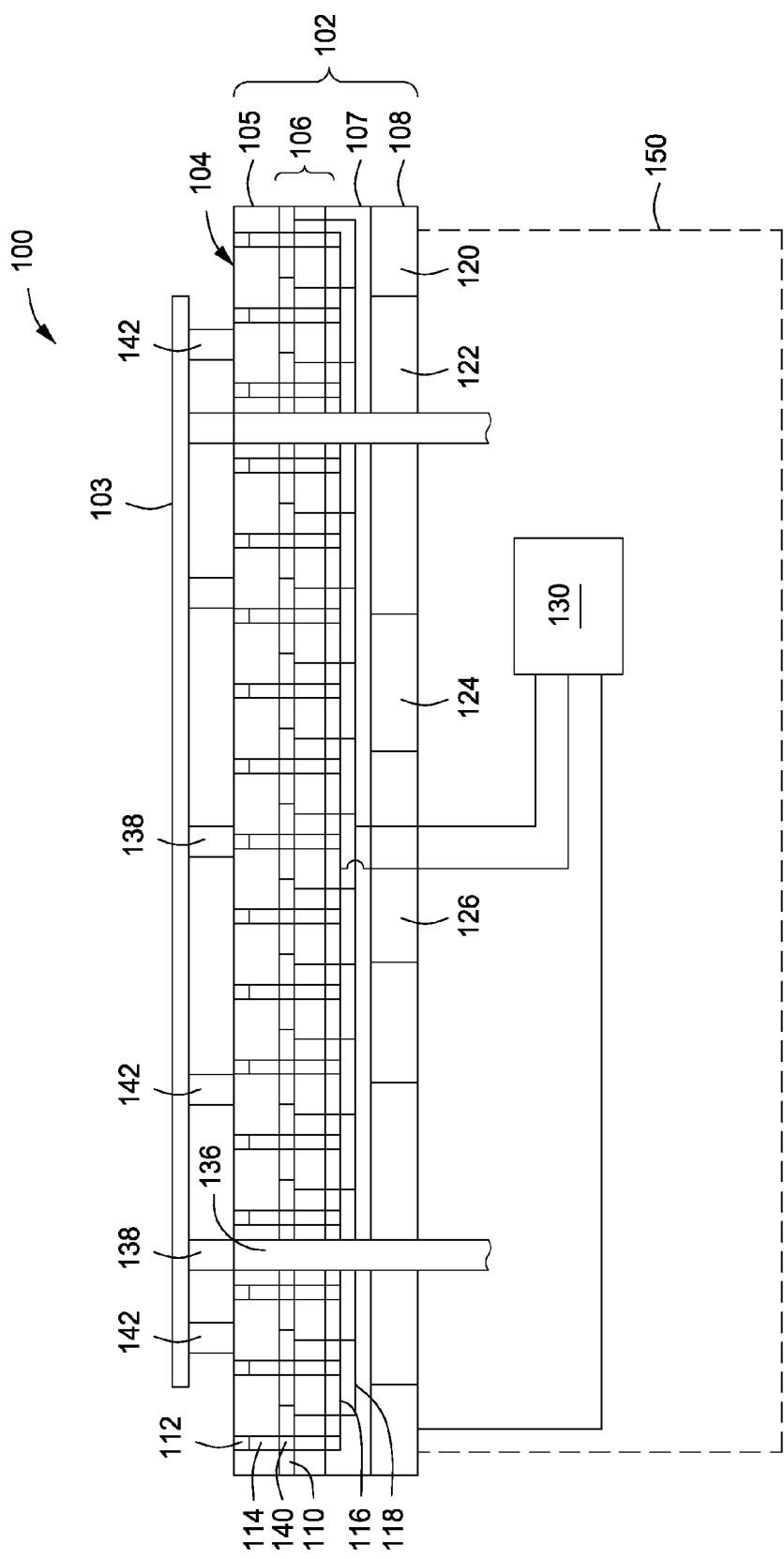
FIG. 1A depicts a cross-sectional schematic view of a substrate support in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of substrate supports having a heater are disclosed herein. The inventive substrate support may advantageously facilitate one or more of heating a substrate, maintaining the temperature of a substrate, or distributing heat to a substrate in a desired profile.

Figure 1B:
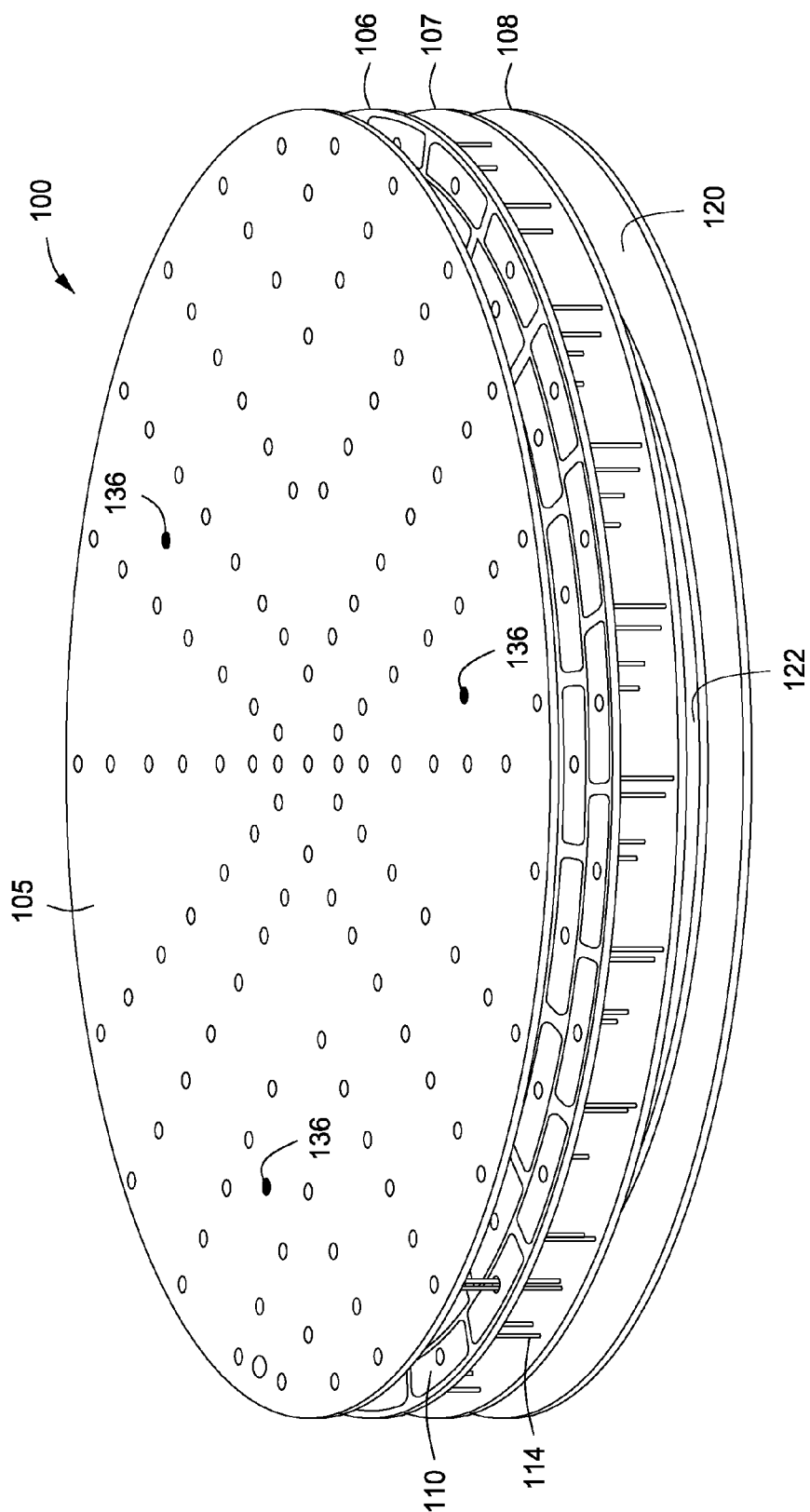
FIG. 1B depicts an isometric exploded view of the substrate support of FIG. 1A, in accordance with some embodiments of the present invention.

FIG. 1A depicts a substrate support 100 in accordance with some embodiments of the present invention. FIG. 1B depicts an isometric exploded view of the substrate support 100 of FIG. 1A, in accordance with some embodiments of the present invention. To best understand the invention, the reader should refer simultaneously to FIGS. 1A and 1B. The substrate support 100 may include a multilayer heater assembly 102 to distribute heat to a substrate 103 when present above the multilayer heater assembly 102. The multilayer heater assembly 102 may include multiple heater segments for heating specific sections of a 200, 300, and or 450 mm substrate 103 (or other size or shape substrate). In some embodiments, the multilayer heater assembly 102 may include a first member 105, a second member 106 disposed beneath the first member, a third member 107 disposed beneath the second member, and a fourth member disposed beneath the third member. Although four layers/members are discussed with respect to FIG. 1, additional layers (for example thermally or electrically insulative layers) may also be included in the multilayer heater assembly 102 as necessary. Similarly, in some embodiments, fewer layers may be used as necessary. In addition, in this document, relational terms such as first and second, top and bottom, above and below, and the like may be used solely to distinguish one entity or action from another entity or action without necessarily requiring or implying any actual such relationship or order between such entities or actions. Furthermore, although depicted in FIG. 1B as circular disks, in some embodiments, the multilayer heater assembly 102 and its components may have any suitable geometry as required for use within a particular process chamber.

The first member 105 may be used to distribute heat to a substrate 103 when present above a first planar surface of the first member 104 (i.e., an upper surface 104 of the multilayer heater assembly 102). The first member 105 may be heated from below via one or more of the other layers included in the multilayer heater assembly 102. In some embodiments, the first member 105 may be comprised of a plurality of layers sintered or otherwise bonded to each other to form the first member 105.

Figure 2:
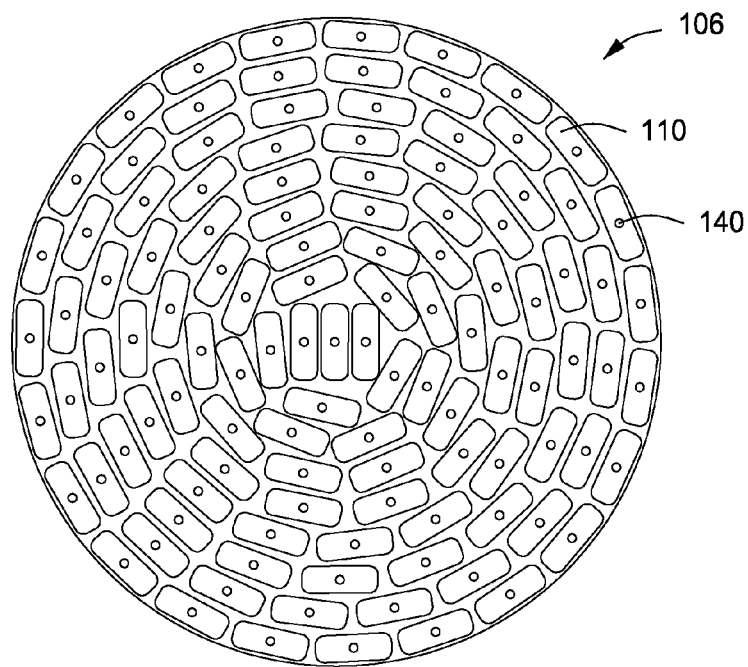
FIG. 2 is an isometric view of a second layer of a multilayer heater in accordance with some embodiments of the present invention.

In some embodiments, the first member 105 may be heated by, at least, a plurality of resistive heating elements 110 disposed on a top planar surface of the second member 106. The plurality of resistive heating elements 110 may be disposed on the second member 106 such that the plurality of resistive heating elements 110 uniformly and substantially cover the entire surface area of the top surface of the second member as shown in FIG. 2. In some embodiments, each resistive heating element 110 may configured to be independently controlled. In other embodiments, the plurality of resistive heating elements 110 are grouped into a plurality of heating zones, wherein each of the plurality of heating zones is configured to be independently controlled. In some embodiments, the number of the plurality of resistive heating elements disposed on the second member may be from 2 resistive heating elements to thousands of resistive heating elements depending on the size of each resistive heating element and the power/heating requirements desired. In some embodiments, the minimum number of resistive heating elements 110 required to provide the heating profile granularity desired is about 50 resistive heating elements.

In some embodiments, a deposition technique may be used to form a desired pattern of resistive heating elements 110 on the second member 106. For example, the one or more resistive heating elements 110 may comprise platinum, nickel-chromium based alloys, resistive ceramics, or other suitable resistive heating materials. In some embodiments, after the deposition of the one or more resistive heating elements 110 is complete, a coating may be used to cover the one or more heating elements. The coating may comprise an electrically insulating material, such as a glass, ceramic, or the like. In some embodiments, the second member 106 may be comprised of a plurality of layers sintered or otherwise bonded to each other to form the second member 106. Each of the plurality of layers that form the second member 106 may include their own set of one or more resistive heating elements 110. In embodiments, where the second member 106 is comprised of a plurality of layers, each of the plurality of layers may be separated by an insulating layer as well.

Returning to FIG. 2, although illustrated as being uniformly distributed, the plurality of resistive heating elements 110 may be distributed in any suitable configuration that is desired to provide a desired temperature profile on the substrate 103. Each of the resistive heating elements 110 may be coupled to a power source included in control system 130 (and shown in FIG. 4). The power source may provide any suitable type of power, such as direct current (DC) which is compatible with the resistive heating elements 110. The power source may be coupled to and controlled by the control system 130, or by another controller (not shown), such as a system controller for controlling a process chamber having the substrate support disposed therein, or the like.

Returning to FIGS. 1A and 1B, as discussed above, the first member 105 may be utilized to distribute heat to specific areas of the substrate 103 with finer granularity and control. For example, the first member may act as a heat spreader to diffuse the heat provided by the plurality of resistor heating elements 110 and/or base heating zones 120, 122, and 124 (discussed below). The base heating zones 120, 122, and 124 provide one or more zones of gross temperature control to first member 105, while the plurality of resistive heating elements 110 are independently controlled to provide local temperature compensation to the first member 105. The plurality of resistor heating elements 110 provide some embodiments, multilayer heating assembly 102 may include a plurality of temperature monitoring devices 112. In some embodiments, the temperature monitoring devices 112 may be embedded in, or disposed on, the first member 105 or extending through the first member 105 to monitor the temperature being provided to the substrate 103 at one or more positions along the first surface 104 of the first member 105. The temperature monitoring devices 112 may include any suitable device for monitoring temperature, such as one or more of a temperature sensor, resistance temperature device (RTD), optical sensor, or the like. The temperature monitoring devices 112 may be coupled to a second set of electrical conductors 118 disposed on the third member, and electrically coupled to a control system 130 that receives temperature information from each of the plurality of the temperature monitoring devices 112. In some embodiments, each temperature monitoring devices 112 includes a connection 114 disposed through an opening 140 formed in a corresponding resistive heating element 110 on the second member 106. An end of the connection contacts the second set of electrical conductors disposed on the fourth member 108.

In some embodiments, each temperature monitoring devices 112 is disposed on, for example by printing, a bottom surface of the first member 105. In other embodiments, each temperature monitoring devices 112 is disposed through one of a plurality of holes formed in the first member 105 such that a top portion of each temperature monitoring device 112 extends to the top surface of the first member 105 as shown in FIGS. 1A and 1B.

The multilayer heater assembly 102 may include a third member 107 disposed beneath the second member 106, the third member 107 including a first set of electrical conductors 116 coupled to each of the resistive heating elements 110. The third member 107 may function as a facilities management plate, such as for wire management to the one or more resistive heating elements 110 or the like. In some embodiments, the third member 107 may also serve as a thermal insulator, preventing convective losses to environment below. For example, when used as a thermal insulator, the third member 107 may comprise a thermally resistive material, such as a glass-ceramic material, or any suitable thermally resistive material.

Figure 1C:
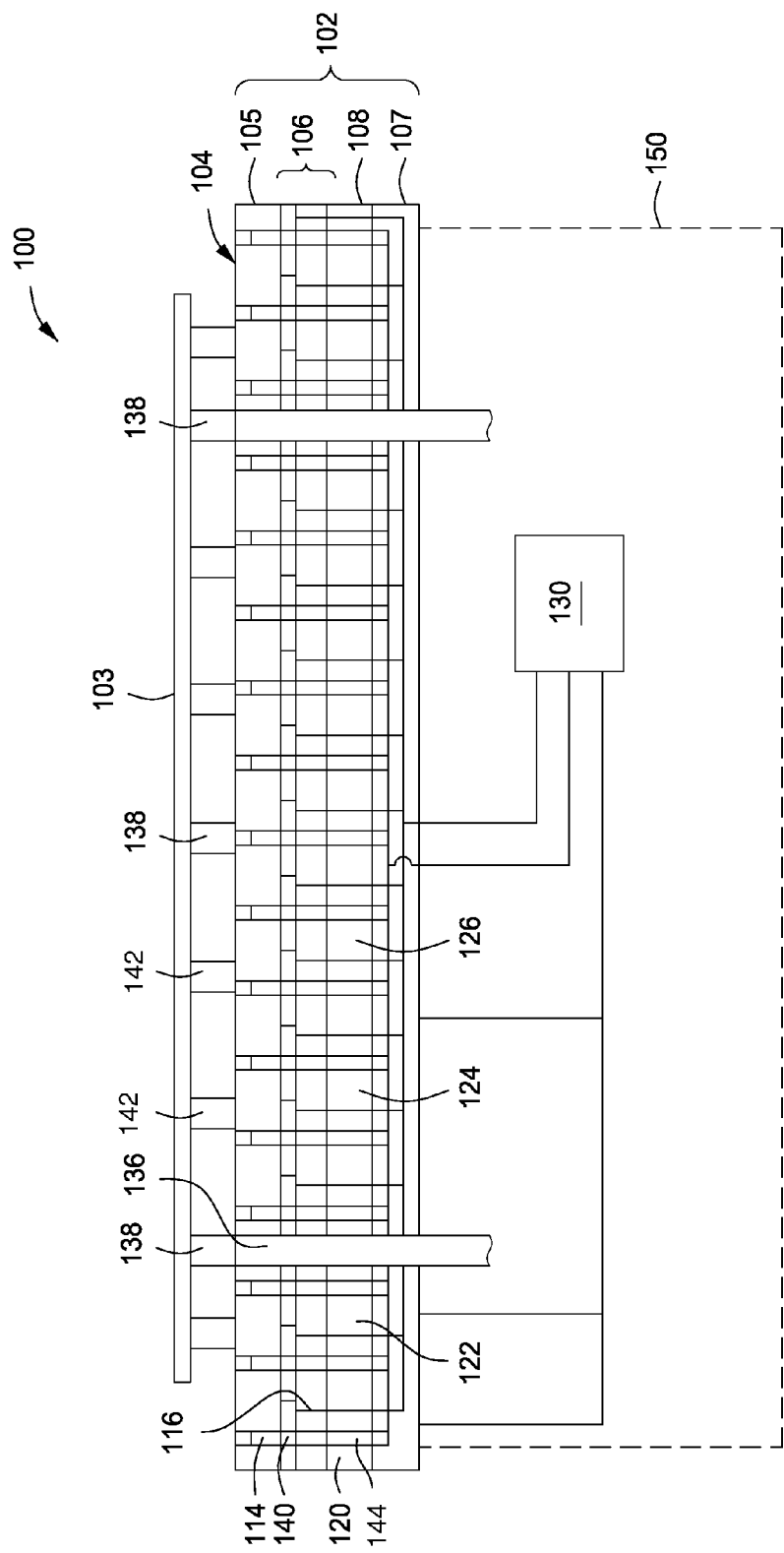
FIG. 1C depicts a cross-sectional schematic view of a substrate support in accordance with some embodiments of the present invention.

In some embodiments, the multilayer heater assembly 102 may include a fourth member 108 that provides include one or more base heating zones. In some embodiments, the fourth member 108 may be disposed beneath the third member 107 as shown in FIGS. 1A and 1B. In other embodiments, the fourth member 108 may be disposed between the second member 106 and the third member 107 as shown in FIG. 1C. As shown in FIG. 1C, when the fourth member 108 is disposed between the second member 106 and the third member 107, the fourth member 108 may include a plurality of openings 144 that electrical conductors 116 pass through to connect to the third member.

Figure 3:
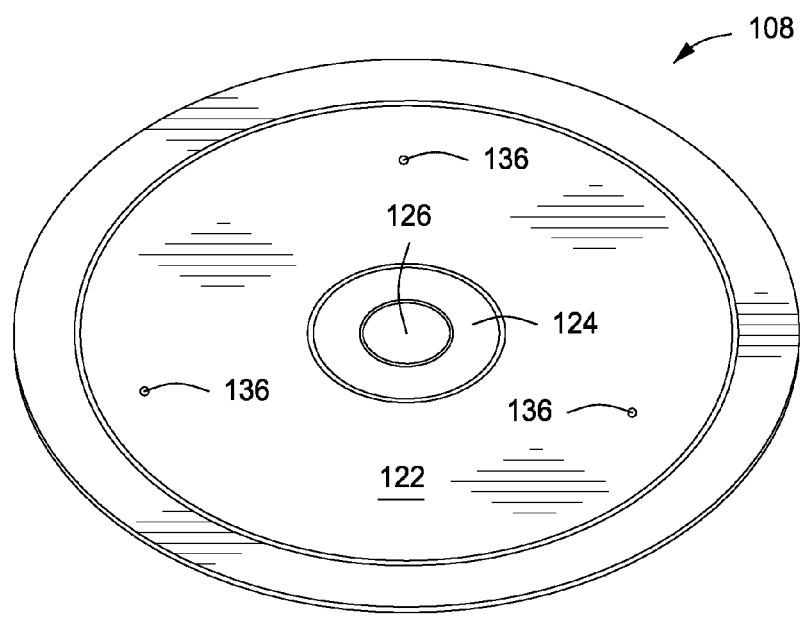
FIG. 3 is an isometric view of a fourth layer of a multilayer heater in accordance with some embodiments of the present invention.

As shown in FIG. 3, the fourth member 108 may include one or more base heating zones 120, 122, and 124 which underlies and spans the multilayer heater assembly 102 to provide base heat to the first member 105. Although three base heating zones are shown, more or less heating zones may be used. The one or more base heating zones 120, 122, and 124 may be utilized to achieve a base temperature across the first member 105 and the plurality of resistive heating elements 110 may be utilized for fine adjustment of the temperature in each location of the first member 105, for example, to achieve a uniform distribution of temperature on the substrate 103 or to achieve a desired non-uniform distribution of temperature on the substrate 103. In some embodiments, base heating zones 120, 122, and 124 may be controlled by the control system 130 in response to temperature information provided by temperature monitoring devices similar to those discussed below. In at least some embodiments, the one or more base heating zones include three concentric base heater zones as shown in FIGS. 1A and 3, each base heater zone being independently controlled.

In some embodiments, the multilayer heater assembly 102 may provide temperatures ranging from about 50 degrees Celsius to about 800 degrees Celsius through the use of the plurality of resistive heating elements 110 and/or the base heating zones 120, 122 and 124. However, embodiments of the substrate support disclosed herein are not limited to the above-mentioned temperature range.

The fourth member 108 may an include opening 126, for example, centrally disposed through the fourth member 108. The opening 126 may be utilized to couple a feedthrough assembly 150 to the members 105, 106, 107, and 108 of the substrate support 100. For example, the first set of electrical conductors 116 which are coupled to the resistive heating elements 110 at one end, may be electrically connected to a first set of common wires at a center portion of the third member 107 that pass through opening 126 and connect to feedthrough assembly 150. Similarly, in some embodiments, the second set of electrical conductors 118 disposed on the third member 107 are electrically connected to a second set of common wires at a center portion of the third member 107 that pass through opening 126 and connect to feedthrough assembly 150. The feedthrough assembly 150 may provide connectivity to various sources and/or control devices, such as a control system 130 to the one or more members 105, 106, 107, and 108, discussed below in more detail with respect to FIGS. 4 and 5. In addition, in some embodiments, the feedthrough assembly 150 may include a conduit (not shown) which can at least one of provide a gas to the backside of the substrate 103, or provide a vacuum to secure the substrate 103 to the substrate support 100.

In some embodiments the first, second, third, and fourth members 105, 106, 107, and 108 may be fabricated from a same base material to limit thermal deformation between the members. The members 105, 106, 107, and 108 may be formed of suitable process-compatible materials, such as materials having one or more of high thermal conductivity, high rigidity, and a low coefficient of thermal expansion. In some embodiments, the base material of each member 105, 106, 107, and 108 may have a thermal conductivity of at least about 25 W/mK. In some embodiments, the members may have a coefficient of thermal expansion of about $9 \times 10^{-6}/°$ C. or less. Examples of suitable materials used to form the members may include one or more of aluminum (Al), or alloys thereof, aluminum nitride (AlN), silicon nitride ($Si_3N_4$), aluminum oxide ($Al_2O_3$), silicon carbide (SiC).

The members of the substrate support 100 may be coupled together by any suitable mechanism. For example, suitable mechanisms may include gravity, adhesives, bonding, brazing, molding, mechanical compression (such as by screws, springs, one or more clamps, vacuum, or the like), or the like.

In some embodiments, the substrate support 100 may include a plurality of substrate support pins 142 disposed on the top surface 104 of the first member 105 to support a backside surface of the substrate 103 a first distance above top surface 104. In some embodiments, the substrate 103 is placed on substrate support pins 142 using plurality of substrate lift pins 138. The plurality of substrate lift pins 138 may be movably disposed through support pin holes 136 formed in each of the members 105, 106, 107, and 108.

Figure 4:
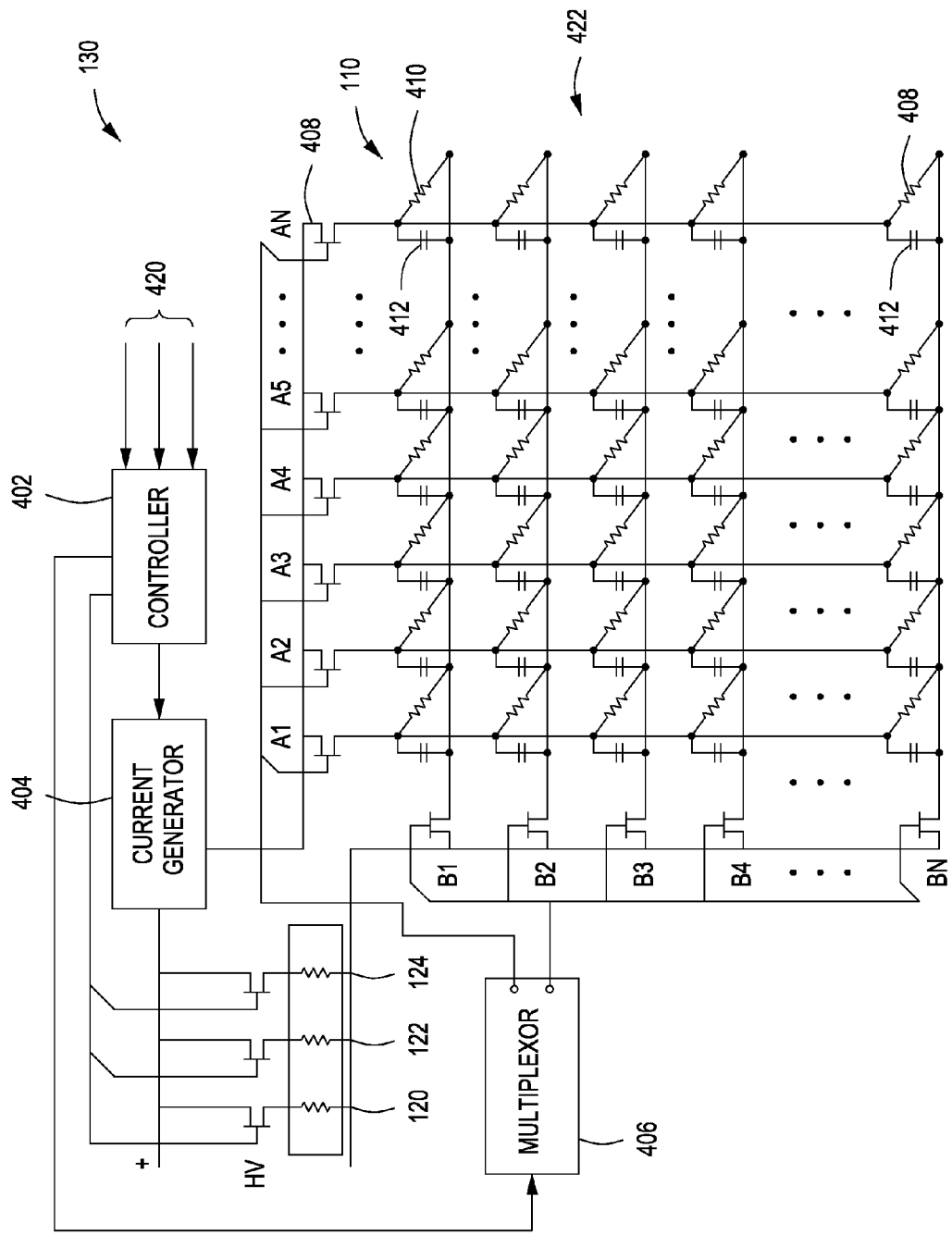
FIG. 4 depicts control block diagram of a control system for providing power to a substrate support heater in accordance with some embodiments of the present invention.

FIG. 4 depicts a control block diagram of control system 130. In some embodiments, control system 130 includes a controller 402, a power source 404, a multiplexor 406, and a plurality of transistor switches 408 for turning power from the power source on and off to the resistive heating elements 110 and temperature monitoring devices 112. In some embodiments, as shown in FIG. 4, each resistive heating element 110 includes a heater segment 410. Each heater segment 410 is electrically coupled (via one or more transistor switches 408) to a capacitor 412 disposed in control system 130. Also shown in the control block diagram of FIG. 4 are three base heater zones 120, 122, and 124 which are also controlled by control system 130.

The grid pattern 422 of resistive heating elements 110 schematically represents the configuration of the electrical conductors disposed on the third member 107 for connecting resistive heating elements 110 to the control system 130 via the first set of common wires. The configuration of control system 130 and the wiring layout shown advantageously minimizes the number of wires required to provide power to high numbers of resistive heating element 110. For example, FIG. 4 depicts 130 resistive heating elements 110 (10 columns A1-A10, and 13 rows B1-B10). However, instead of 260 wires connecting each resistive heating element 110, only 23 wires are required 110 (10 columns A1-A10+13 rows B1-B10). The multiplexor 406 and the transistor on/off switches 408 control which resistive heating elements 110 receive power. In some embodiments, power source 404 may be a current generator. In operation, the current generator 404 provides a constant current to the grid 422. If the resistive heating element 110 at location A1-B1 is to be powered, multiplexor 406 turns on the transistors 408 at locations A1 and B1. The capacitor 412 at A1-B1 would then be charged by the current supplied from current generator 404 and release the current to the heater segment 410 at location A1-B1.

The multiplexor 406 is controlled by controller 402. In some embodiments, the controller 402 received one or more inputs 420. Those inputs 420 may include a temperature map provided by the temperature monitoring devices 112 (as described below with respect to FIG. 5), a base heater map, and a heater model. Based at least in part on those inputs, the controller 402 controls the power source 404 and the multiplexor 406.

In some embodiments, to control the multiple numbers of heaters in a certain amount of time, each individual heater must be controlled within a specific time window. For example, if 100 heaters are to be controlled/powered within 1 second window, each individual heater must be controlled within 10 ms (100 heaters*10 ms=1 second). Thus, if time is fixed at 10 ms, the amplitude of the current applied to charge each corresponding capacitor 412 is changed based on the requested power set by the control system, in order to charge each capacitor to the desired voltage within the time window. During the 10 ms time window, the capacitor 412 voltage is charged based on the requested power. After capacitors 412 voltage are completely charged, a discharge cycle of the capacitors 412 is performed at a slower rate to avoid a large power spike on the heater. During the discharge cycle, the capacitors 412 discharge their stored voltage to the respective heater segments 410.

Figure 5:
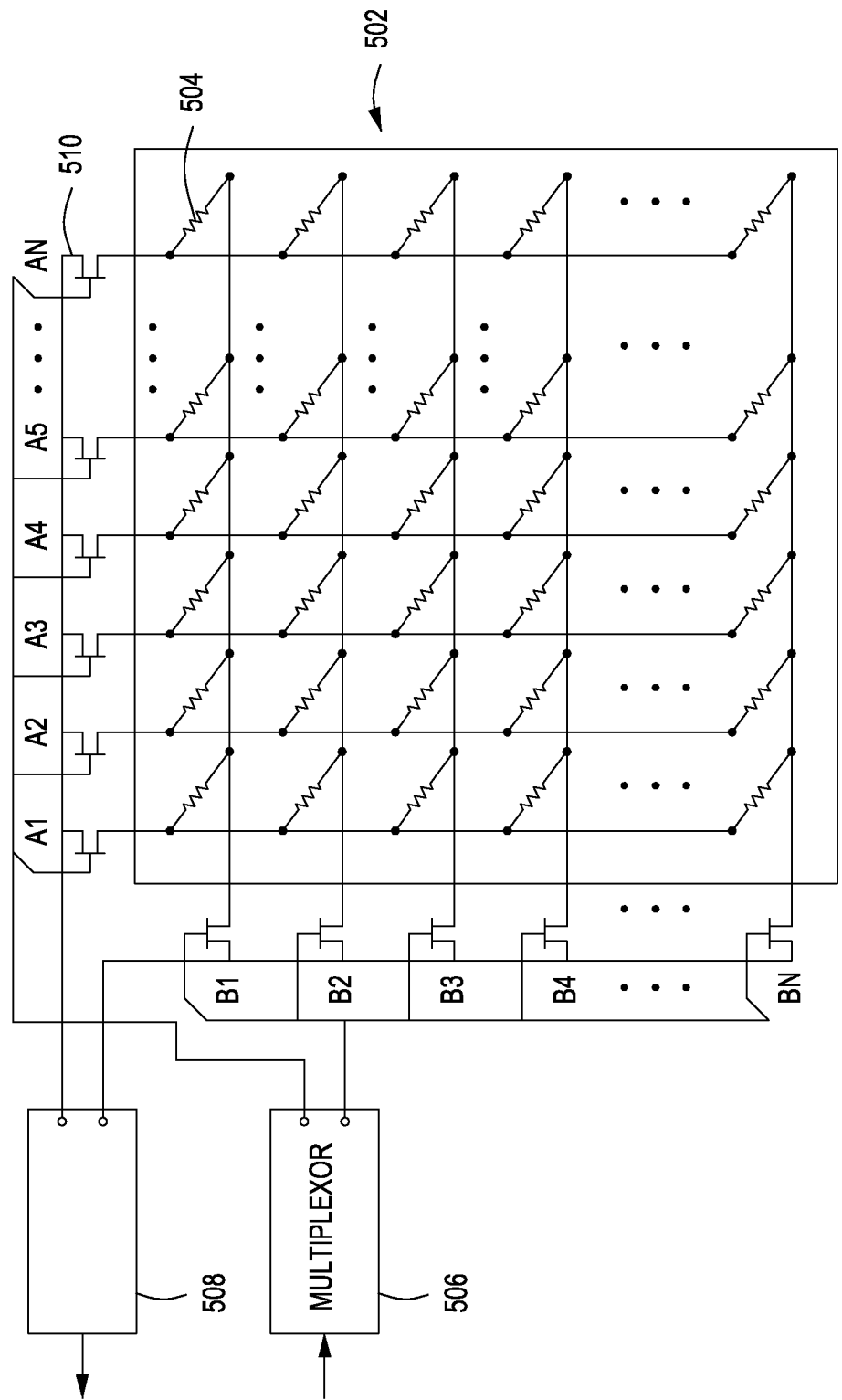
FIG. 5 depicts control block diagram of a control system for measuring temperature in accordance with some embodiments of the present invention.

FIG. 5 depicts a control block diagram of the control system 130 for controlling and receiving information from a grid 502 of temperature monitoring devices 112. As shown in FIG. 5, in some embodiments, the control system 130 may include a temperature determination module 508 for receiving temperature information/electrical signals from the grid 502 of temperature monitoring devices 112 represented by resistors 504. The control system 130 may also include a multiplexor 506, and a plurality of transistor switches 510 for turning opening and closing the circuits coupled to the temperature monitoring devices 112. Resistor s504 in the block diagram represent temperature monitoring devices 112 (such as RTD as described above) whereas resistance is a function of temperature. In order to measure temperature of a certain area, multiplexor 506 selects corresponding RTDs. For instance switching ON transistors 510-B12 and 510-A10 by multiplexor 506 will provide the current through RTD $504_{A10-B12}$. The current is generated by temperature determination module 508. The voltage drop across RTD is proportional to temperature and converted to temperature by temperature determination module 508. Control module 402 make determination which RTD device need to be read to feed temperature information back.

Thus, embodiments of substrate supports have been disclosed herein. The inventive substrate support may advantageously facilitate one or more of heating a substrate, maintaining the temperature of a substrate, or uniformly distributing heat to a substrate, or create temperature non-uniformities on a substrate.

While the foregoing is directed to embodiments of the present invention, other and further embodiments of the invention may be devised without departing from the basic scope thereof.

The invention claimed is:

1. A substrate support, comprising:
   a first member to distribute heat to a substrate when present above a first planar surface of the first member;
   a second member disposed beneath the first member, the second member including at least ten separate and independently controllable resistive heating elements, wherein the at least ten separate and independently controllable resistive heating elements provide local temperature compensation to the first member to heat the substrate when present;
   a fourth member disposed beneath the second member, the fourth member including at least three separate and independently controllable base heating zones to provide a base temperature profile to the first member; and
   a third member disposed beneath the fourth member, the third member including a first set of electrical conductors coupled to each of the resistive heating elements.

2. The substrate support of claim 1, wherein the at least ten separate resistive heating elements are grouped into a plurality of heating zones, wherein each of the plurality of heating zones is configured to be independently controlled.

3. The substrate support of claim 1, further comprising:
   a plurality of temperature monitoring devices to measure temperature disposed on the first member and coupled to a second set of electrical conductors disposed on the third member.

4. The substrate support of claim 3, wherein each temperature monitoring devices includes a connection disposed through an opening formed in a corresponding resistive heating element on the second member, and wherein an end of the connection contacts the second set of electrical conductors disposed on the third member.

5. The substrate support of claim 3, wherein each temperature monitoring device is printed on a bottom surface of the first member.

6. The substrate support of claim 3, wherein each temperature monitoring device is disposed through one of a plurality of holes formed in the first member such that a top portion of each temperature monitoring device extends to a top surface of the first member.

7. The substrate support of claim 3, wherein the first set of electrical conductors disposed on the third member are electrically connected to a first set of common wires at a center portion of the third member, wherein the first set of common wires is less than a number of resistive heating elements disposed on the second member.

8. The substrate support of claim 7, wherein the first set of common wires feed through a central opening formed in the third member.

9. The substrate support of claim 8, wherein the second set of electrical conductors disposed on the third member are electrically connected to a second set of common wires at a center portion of the third member, wherein the second set of common wires is less than a number of temperature monitoring devices disposed on the first member.

10. The substrate support of claim 9, wherein the second set of common wires feed through the central opening formed in the third member.

11. The substrate support of claim 3, further comprising:
    a control system coupled configured to receive input from the plurality of temperature monitoring devices and to control each of the at least ten separate resistive heating elements, wherein the control system includes a first multiplexor electrically coupled to at least ten separate resistive heating elements and a second multiplexor electrically coupled to the plurality of temperature monitoring devices.

12. The substrate support of claim 1, wherein the second member is a ceramic substrate and wherein the at least ten separate resistive heating elements are fabricated from a metallic material.

13. The substrate support of claim 1, wherein the at least ten separate resistive heating elements are disposed on the second member such that the at least ten separate resistive heating elements uniformly and substantially cover the entire surface area of the top surface of the second member.

14. The substrate support of claim 1, wherein each of the one or more base heating zones heats an area of the first member that is greater than an area heated by two or more of the at least ten separate resistive heating elements.

15. The substrate support of claim 14, wherein the one or more base heating zones are disposed directly below at least some of the at least ten separate resistive heating elements such that an area of the first member heated by the one or more base heating zones and the at least some of the plurality of resistive heating elements is the same.

16. The substrate support of claim 1, wherein the at least ten separate resistive heating elements includes at least 7 resistive heater elements to provide a desired temperature profile resolution to the first member.

17. The substrate support of claim 1, further comprising:
a plurality of substrate support pins disposed on the first planar surface of the first member to support a backside surface of a substrate when present on the substrate support;
a plurality of lift pins holes formed through each of the first, second, third and fourth members; and
a plurality of substrate lift pins movably disposed in the plurality of lift pins holes and configured to move the substrate onto the plurality of substrate support pins.

18. A substrate support, comprising:
a multilayer heater comprising:
    a first member to distribute heat to a substrate when present above a first planar surface of the first member;
    a second member disposed beneath the first member, the second a second member disposed beneath the first member, the second member including at least ten separate and independently controllable resistive heating elements, wherein the at least ten separate and independently controllable resistive heating elements provide local temperature compensation to the first member to heat the substrate when present;
    a fourth member disposed beneath the second member, the fourth member including at least three separate and independently controllable base heating zones to provide a base temperature profile to the first member; and
    a third member disposed beneath the fourth member, the third member including a first set of electrical conductors coupled to each of the resistive heating elements;
a plurality of substrate support pins disposed on the first planar surface of the first member to support a backside surface of a substrate when present on the substrate support;
a plurality of lift pins holes formed through each of the first, second, third and fourth members;
a plurality of substrate lift pins movably disposed in the plurality of lift pins holes and configured to move the substrate onto the plurality of substrate support pins; and
a control system coupled configured to receive input from a plurality of temperature monitoring devices and to control each of the at least ten separate resistive heating elements, wherein the control system includes a first multiplexor electrically coupled to the at least ten separate resistive heating elements and a second multiplexor electrically coupled to the plurality of temperature monitoring devices.

* * * * *